United States Patent
Foley et al.

(10) Patent No.: US 10,107,877 B2
(45) Date of Patent: Oct. 23, 2018

(54) CIRCUIT BOARD INTEGRATED ATOMIC MAGNETOMETER AND GYROSCOPE

(71) Applicant: Twinleaf LLC, Princeton, NJ (US)

(72) Inventors: Elizabeth L. Foley, Princeton, NJ (US); Thomas W. Kornack, Princeton, NJ (US)

(73) Assignee: Twinleaf LLC, Princeton, NJ (US)

( * ) Notice: Subject to any disclaimer, the term of this patent is extended or adjusted under 35 U.S.C. 154(b) by 0 days.

(21) Appl. No.: 15/471,910

(22) Filed: Mar. 28, 2017

(65) Prior Publication Data

US 2017/0199254 A1    Jul. 13, 2017

Related U.S. Application Data

(63) Continuation of application No. 15/016,985, filed on Feb. 5, 2016, now Pat. No. 9,638,768, which is a continuation of application No. PCT/US2015/033748, filed on Jun. 2, 2015.

(60) Provisional application No. 62/006,535, filed on Jun. 2, 2014.

(51) Int. Cl.
  *G01R 33/26* (2006.01)
  *G01C 19/62* (2006.01)

(52) U.S. Cl.
  CPC ............. *G01R 33/26* (2013.01); *G01C 19/62* (2013.01)

(58) Field of Classification Search
  None
  See application file for complete search history.

(56) References Cited

U.S. PATENT DOCUMENTS

| | | | | |
|---|---|---|---|---|
| 3,495,161 | A * | 2/1970 | Bell | G01N 24/006 324/304 |
| 5,189,368 | A * | 2/1993 | Chase | G01R 33/032 102/417 |
| 6,472,869 | B1 * | 10/2002 | Upschulte | G01R 33/26 324/300 |
| 7,038,450 | B2 * | 5/2006 | Romalis | G01R 33/02 324/301 |
| 9,638,768 | B2 * | 5/2017 | Foley | G01R 33/032 |
| 9,915,711 | B2 * | 3/2018 | Kornack | G01R 33/26 |
| 2013/0147472 | A1 * | 6/2013 | French | G01R 33/032 324/252 |
| 2014/0121491 | A1 * | 5/2014 | Zhang | A61B 5/04008 600/409 |
| 2014/0247045 | A1 * | 9/2014 | Kornack | G01R 33/26 324/304 |
| 2015/0130456 | A1 * | 5/2015 | Smith | G01R 33/26 324/301 |
| 2016/0231395 | A1 * | 8/2016 | Foley | G01R 33/032 |
| 2016/0352345 | A1 * | 12/2016 | Hashi | H03L 7/26 |

(Continued)

*Primary Examiner* — Jermele M Hollington
(74) *Attorney, Agent, or Firm* — Foley Hoag LLP (57) ABSTRACT

Magnetometers, atomic sensors and related systems, methods and devices are disclosed. In one configuration, an assembly for use in a high-sensitivity atomic sensor can include an alkali vapor cell, at least one illumination source configured to emit light when activated, the emitted light having a first predetermined range of wavelengths, a light collector capable of collecting light in the first predetermined range of wavelengths, and a plurality of optical elements arranged such that (a) light emitted from the at least one illumination source is directed to the alkali vapor cell, and (b) light emerging from the alkali vapor cell is directed to the light collector.

18 Claims, 10 Drawing Sheets

(56) References Cited

U.S. PATENT DOCUMENTS

2017/0160352 A1* 6/2017 Kornack ................ G01R 33/26
2017/0199254 A1* 7/2017 Foley .................... G01R 33/26

* cited by examiner

Figure 1A

Top View

Figure 1B

End View

Figure 1D

Side View

Figure 2B
Top View

Figure 2C
Side View

Figure 2D
Bottom View

Figure 16

CIRCUIT BOARD INTEGRATED ATOMIC MAGNETOMETER AND GYROSCOPE

This application is filed as a Continuation of and claims priority to U.S. application Ser. No. 15/016,985 filed Feb. 5, 2016, now U.S. Pat. No. 9,638,768 which is a Continuation of and claims priority to PCT/US15/33748 filed Jun. 2, 2015, which claims priority to and the benefit of U.S. provisional application Ser. No. 62/006,535, filed Jun. 2, 2014, which is hereby incorporated herein by reference in its entirety.

BACKGROUND

The performance of high-sensitivity magnetometers, whether vector or scalar field sensors, and related atomic sensors, is improved when the sensors are isolated from magnetic noise, i.e., magnetic fields that are not intended to be part of the measurement. Such stray magnetic fields can originate from the electronics controlling or related to the device itself, including circuit boards and heating elements. We disclose systems, devices and methods that, among other benefits, reduce the incidence of stray magnetic fields in high-sensitivity magnetometers and atomic sensors.

SUMMARY

A device can be used as a vector atomic magnetic field sensor or gyroscope, in the manner described by U.S. Pat. No. 7,038,450, and/or a Bell-Bloom scalar magnetic field sensor as described by U.S. Pat. No. 3,495,161, both of which are hereby incorporated herein by reference in their entireties. Devices disclosed herein include physical implementations of a specific system which may be operated in any such mode, as well as a method of operation.

In some embodiments, such devices can include a sensor assembly having a baseplate upon which all other components are supported, stacked supports, an alkali metal vapor cell, heater, temperature sensor and insulation, illumination sources which may act to pump the alkali metal vapor, to probe the alkali metal vapor, to heat the alkali metal vapor cell, or some combination of these three, optical elements including collimation lenses, polarization modulators, polarizers, waveplates, and/or mirrors, and a detector for the probe illumination. Such devices can also include interconnections between the sensor unit and a computerized control system, the control system itself, and a power source or interface thereto.

DETAILED DESCRIPTION OF THE DRAWINGS

The figures and description herein include a number of different embodiments, the features and properties of any of which can be interchanged and combined as would be appreciated by one of skill in the art.

FIG. 1 schematically shows perspective, top, side, and end views of a particular embodiment of a magnetometer. A baseplate underlies the rest of the system. The baseplate can be a printed circuit board, which can carry control electronics, or, in some embodiments, heating elements. As shown, the baseplate carries two illumination sources and a detector. The illumination sources and detector can be mounted directly on the baseplate or on structures mounted on the baseplate. If the baseplate is a circuit board, the illumination sources and detector may be directly operably connected to a control system through mounting on the circuit board. As is typical, the circuit board can include a stack of conductive tracks, pads and vias etched from thin sheets of copper which are laminated onto a non-conductive substrate, such as fiberglass, polyimide, ceramic, or low-dielectric plastic. A stacked structure of non-conductive, non-magnetic material such as glass, fused silica, crystalline material, fiberglass, polyimide, or plastic is mounted on and affixed to the baseplate with an adhesive such as cyanoacrylate, epoxy resin with hardener, cured silicone rubber, or other product. All components are supported upon this structure, ultimately upon, but not necessarily directly contacting, the baseplate.

As shown in FIG. 1, light from both illumination sources is directed into the vapor cell by way of various optical elements. A wide variety of arrangements of optical elements is possible, as will be appreciated by one of skill in the art. In the embodiment of FIG. 1, each illumination source directs light through a collimating lens. In some embodiments, such as the embodiment of FIG. 1, one of the illumination sources, the pump illumination source, sits directly beneath the vapor cell and illuminates the cell from below. The other illumination source, the probe illumination source, is below and to the side of the vapor cell. The beam from the probe illumination source is reflected horizontally into the vapor cell, and then reflected again after emerging from the vapor cell, down onto a detector, which sits either directly or indirectly on the baseplate.

The illumination sources can be, for example, lamps, LED's or lasers, including diode lasers, vertical cavity surface emitting lasers (VCSELs), grating stabilized diode lasers, or tapered amplifier lasers, or any other appropriate source of light. The pump and probe illumination sources must emit light having a wavelength near the atomic transition of interest in the alkali element chosen for the vapor cell, for example, the rubidium D1 line at 794.8 nm, or the cesium D1 line at 894 nm. In some embodiments, the illumination sources may include a mechanism for varying the wavelength, such as a grating, a heating element, or a variation in current.

As shown in FIG. 1, the vapor cell is supported on stacked supports, separating the vapor cell physically, vertically, from the baseplate. The vapor cell is generally surrounded by an insulating volume and is supported in thermal contact with a heater. The insulation serves to thermally isolate the vapor cell from its surroundings, except on the side adjacent to the heater, which serves to maintain the vapor cell at a desired temperature. The stacked supports serve to physically separate the vapor cell from the baseplate and any electronics, to help isolate the vapor cell both thermally, and electromagnetically. The baseplate, illumination sources, and detector may contain current carrying elements all of which necessarily create at least some non-zero magnetic field, and at least some heat. Separating the vapor cell from current carrying elements reduces external magnetic noise in the neighborhood of the vapor cell and allows for better thermal control. To achieve these benefits, the supports should be non-magnetic and/or thermally insulating. The supports may contain air trapped in voids for thermal insulation, and can be constructed of electrically insulating material.

The vapor cell itself may be fabricated from glass and/or other insulating or semiconductor material. Such vapor cells can be constructed by glassblowing, glass fusing, anodic bonding, glass frit bonding, or other fabrication techniques. The active medium in the cell may be any isotope of lithium, sodium, potassium, rubidium, cesium, francium, or mercury or any combination of these. The cell may contain a buffer gas in addition to the alkali metal, and this gas may include a diatomic gas such as nitrogen, and any of the noble gases including helium, neon, argon, krypton, and xenon. These elements may exist in the cell in any combination. The gas pressure in the cell may be near atmospheric pressure, or it may be near vacuum pressure, or may be many times atmospheric pressure.

The heater is adjacent to and in relatively close thermal contact with the vapor cell. All components of the heater should be able to withstand temperatures up to 200° C. Several different heaters are described in more detail below.

Figure 1A:
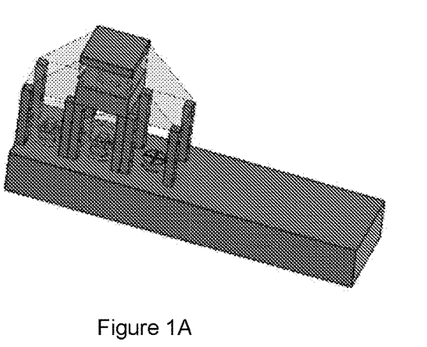
FIGS. 1A-D schematically shows perspective (FIG. 1A), top (FIG. 1B), side (FIG. 1C), and end (FIG. 1D) views of a magnetometer.
Figure 1B:
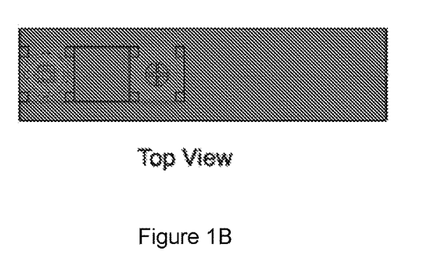
Figure 1C:
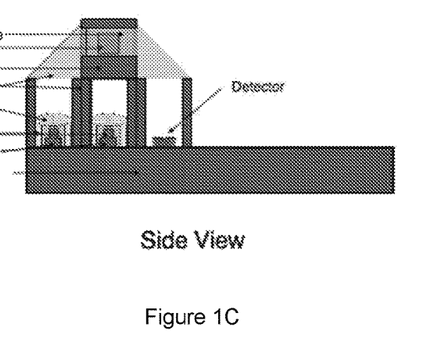
Figure 1D:
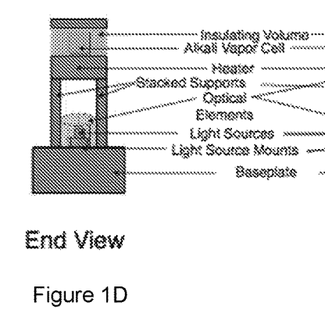
Figures 2A, 2B, 2C:
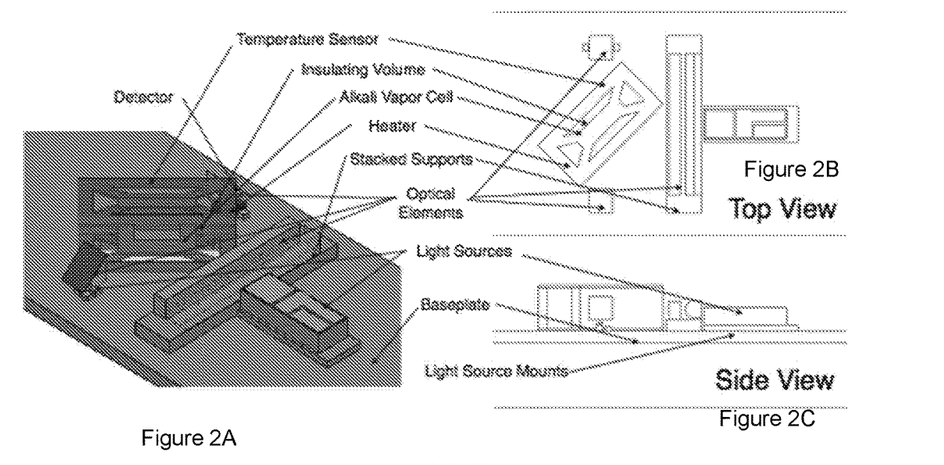
FIGS. 2A-D schematically shows perspective (FIG. 2A), top (FIG. 2B), side (FIG. 2C), and bottom (FIG. 2D) views of a second magnetometer.
Figure 2D:
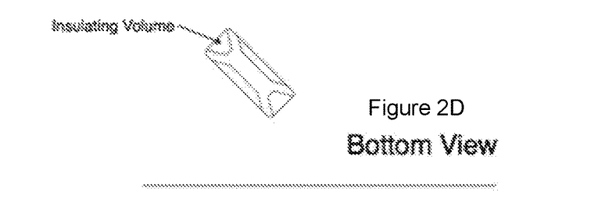

FIG. 2 schematically shows perspective, top, side, and bottom views of a second magnetometer. Although the arrangement is different from the magnetometer of FIG. 1, many of the elements are the same. Like the magnetometer of FIG. 1, in the magnetometer of FIG. 2 light is emitted vertically from the probe illumination source, is reflected horizontally through the vapor cell, and then is reflected down onto an upward facing detector. The pump illumination source, in this case, emits horizontally, parallel to the plane of the baseplate. Various optical elements can be used to optimize the light paths. The vapor cell and its heater are suspended over an opening through the circuit board. In this way, the vapor cell is relatively physically isolated from the circuit board. The suspension is typically made of a thermally insulating, non-magnetic material, e.g., glass, silicone, fiberglass, polyimide, Teflon, or ceramic. Again, the heater will be described in more detail below. The magnetometer of FIG. 2 is laid out in a more generally planar arrangement, but has many of the same attributes and achieves similar benefits as the magnetometer of FIG. 1.

The device of FIG. 2 also includes a temperature sensor adjacent to the vapor cell. A temperature sensor may be used to determine the actual temperature of the alkali metal vapor cell, and this information may be used in a feedback loop to inform the temperature control mechanism in order to achieve a constant temperature in the cell. Some embodiments may not utilize a dedicated temperature sensor, and instead use optical absorption of illumination to gauge the cell temperature. If used, the temperature sensor should be in close thermal contact with the cell, and within the insulating envelope. The temperature sensor may include a resistive element which exhibits a change of resistance with temperature, and electrical connections through which the resistance may be measured. The temperature sensor may include a thick film printed substrate of ceramic or other material such as fiberglass, quartz, macor, alumina, aluminum nitride, boron nitride, polyimide, with films of high-resistance paste such as platinum or graphite which may be screen printed, sprayed, painted or otherwise applied. The design may be such to cancel externally generated field by printing multiple layers alternating between conductor and dielectric (insulating) layers, as explained further below.

Figure 3:
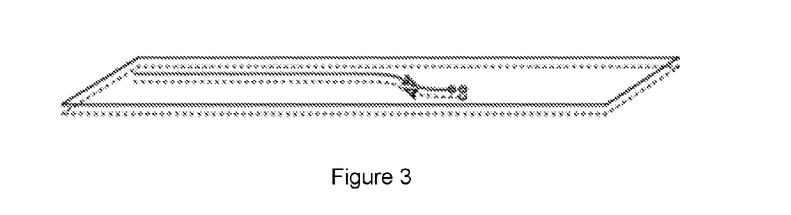
FIG. 3 schematically shows a circuit board assembly.
Figure 4:
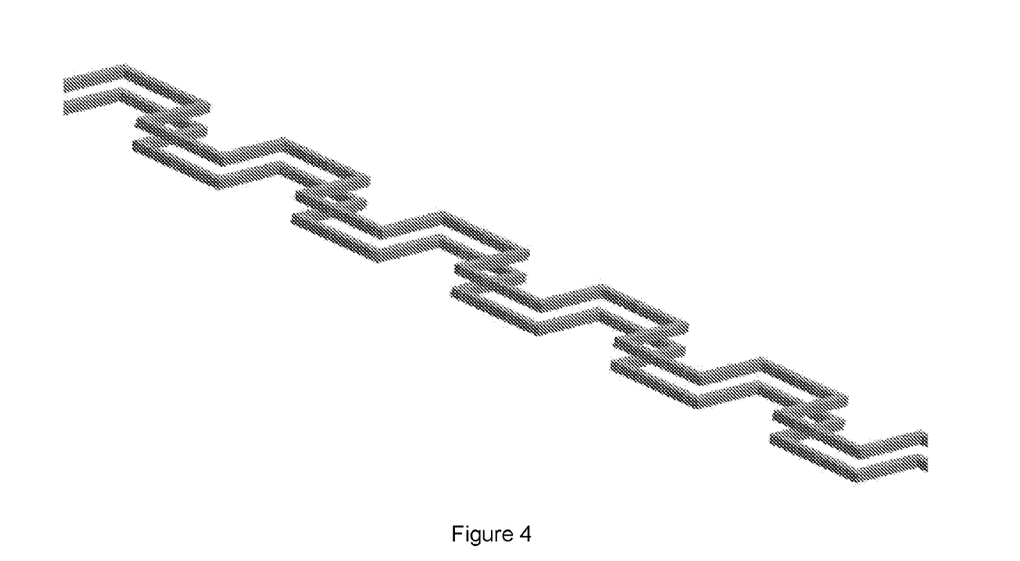
FIG. 4 schematically shows another aspect of a circuit board assembly.

Alternatively, the temperature sensor may consist of a set of thin copper traces encapsulated in layers of printed circuit board. This may include flexible printed circuit board, consisting of etched copper traces on a substrate of non-conducting material which may be fiberglass, polyimide, ceramic or low-dielectric plastic, with a protective layer of acrylic, epoxy or teflon-based adhesive. The copper traces may be laid out in an even number of layers whereupon the majority of the trace in each layer is paired with an identical trace in a very close layer to minimize the externally generated magnetic field when the same current runs through both traces. The thickness and depth of the traces may be approximately equal, and the linear extent of each trace kept to a low value, for example less than 50 times the thickness/depth, in order to minimize the size of thermal eddy currents, as illustrated in FIGS. 3 and 4, which also illustrate the design of an option for the circuit board baseplate and heaters and are explained further below. If a resistive device, the temperature sensor may share a circuit board with other traces, including the heaters, and a single trace may be used for both heating and temperature sensing.

In another embodiment, traces can be filamentized, as in a Litz wire for example, with many narrow, separately electrically insulated filaments making up a single trace. Without wishing to be bound by any particular theory, it is thought that filamentizing the traces can help to minimize thermal eddy currents. By filamentizing the traces, the possible thermal paths available to current carriers in the traces are elongated, making eddy currents less prominent. In other words, the more one dimensional the individual insulated conductors, the less volume there is for current carriers to move randomly in loops that create magnetic fields.

Alternatively, the temperature sensing element may consist of an entirely optical device, for example a fiber optic sensor based on the band-gap variation of the absorption spectrum of a semiconductor such as gallium arsenide with temperature. Or the temperature sensing element may consist of a thermocouple type sensor, in which a pair of wires of dissimilar materials, such as the well-known combinations of nickel and chromium (Type K), copper and constantan (Type T), or tungsten and rhenium (Type C), in which a voltage is induced at the junction depending on the temperature.

Both the devices of FIGS. 1 and 2 are shown as magnetometers, but one of skill in the art will recognize that each could easily be altered to function as a variety of other atomic sensors such as e.g., gyroscopes.

FIG. 3 schematically shows a circuit board assembly arranged to minimize magnetic fields. As explained above, in a sensor like those shown in FIGS. 1 and 2, a circuit board may serve multiple purposes: it may be a structural component on which the various other components are mounted, it can of course carry circuitry for operating the system, and in some embodiments it can function as a heater. Even in a highly conductive trace, electric currents will necessarily create some heat, and if heating is desired, current could be directed to less conductive, more resistive materials. Currents naturally produce magnetic fields as well. The strength of the magnetic field can be reduced or minimized by creating currents whose magnetic fields cancel, for example by arranging for anti-parallel currents to be a close together as possible. The currents may be configured to create any desired configuration of magnetic field in the location of the sensing volume. For example, currents may be configured in a loop or in multiple parallel loops (similar to Helmholtz coils) and adjusted to produce a magnetic field designed to cancel the earth's magnetic field in the vicinity of the sensor. Alternatively, currents can be configured to produce calibration fields or any other predetermined field strength or geometry.

FIG. 3 shows a circuit board that is arranged so that the currents will create substantially mutually cancelling magnetic fields. A trace is created on one side of the circuit board, and a congruent trace is created on the opposite side of the circuit board. A via is created through the board at one end of the two traces. Conductive material is deposited in the via to connect the two traces. The result is a single trace that will naturally direct current along a particular path on one side of the circuit board, and in the opposite direction along a congruent path on the opposite side of the circuit board. The anti-parallel current elements here will result in substantially cancelling magnetic fields, thus minimizing interference with nearby magnetic field measurements. This arrangement can be used regardless of the function of the current, whether it is for controlling circuitry, or heating, or any other purpose.

FIG. 4 schematically shows another aspect of a circuit board assembly. Two congruent traces are shown, as they would be deployed on opposite sides of the electrically insulating substrate of a circuit board. The circuit board has been omitted for clarity. The particular shape of the traces shown have been optimized in several different ways to minimize the spontaneous creation of transient magnetic fields. Without wishing to be bound by any theory, it is thought that the particular shapes of the traces shown have several properties that tend to reduce the prominence of thermal eddy currents that generate transient magnetic fields. The traces shown in FIG. 4 have been designed so as to (1) include a relatively tortuous path from one end to the other, (2) have a height that is comparable to the width of the trace, for example a ratio of height to width of 0.1 to 10, 0.5 to 2, 0.9 to 1.1, or about 1, and (3) include no straight sections longer than a predetermined length. The maximum length of a straight section of the trace can be, for example, 100, 50, 25, 10 or 5 times the width or height of trace.

Figures 5A, 5B:
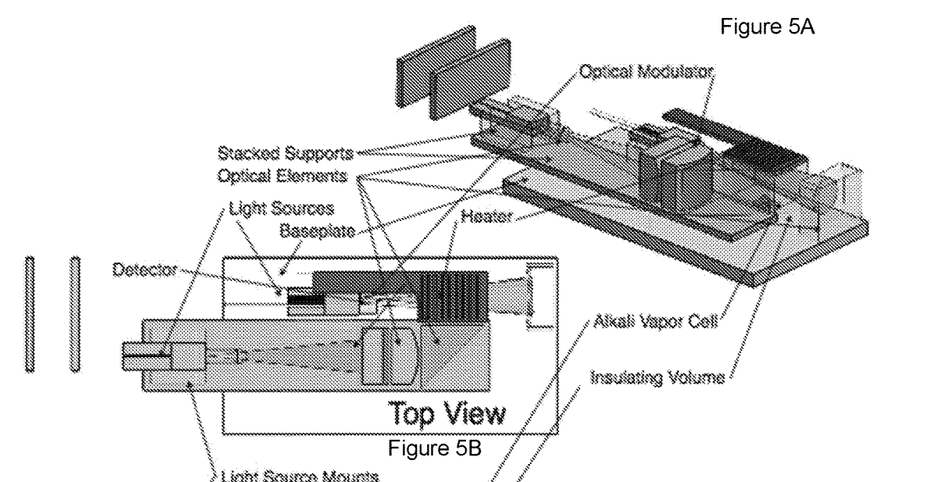
FIGS. 5A-D schematically shows perspective (FIG. 5A), top (FIG. 5B), side (FIG. 5C), and end (FIG. 5D) views of a third magnetometer.

Although only two traces are shown in each of FIGS. 4 and 5, multiple pairs of traces can be simultaneously employed in a single system, either adjacent to one another, or in layered or stacked arrangements.

Figure 5C:
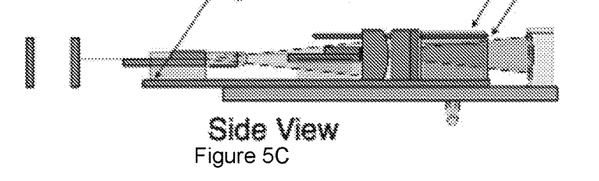
Figure 5D:
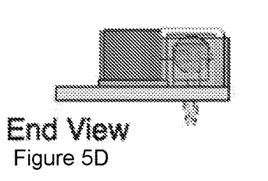

FIG. 5 schematically shows perspective, top, side, and end views of a third magnetometer. The various elements of the magnetometer will now generally be familiar, including a baseplate, illumination sources, a vapor cell, a detector, optical elements and a heater, although the layout of the particular magnetometer shown in FIG. 5 is different than those of FIGS. 1 and 2 in that the light from the probe illumination source passes through the vapor cell twice, in opposite directions, having been reflected from a mirror behind the vapor cell back toward a detector that is adjacent to the probe illumination source. This magnetometer also includes an optical modulator in the optical path of the pump beam. The optical modulator will have the capability to vary the polarization state of the pump beam illumination in time via a remote signal. It may consist of an electro-optically active material and an electrical signal to control it. The optical modulator may consist of a material with optical properties that can be controlled by the application of illumination, such as a polymer film or liquid crystal doped with a dye such as azobenzene, or a biologically derived protein such as bacteriorhodopsin, and an illumination source to effect the control. Alternatively, the optical modulation may be effected by variation of an applied magnetic field in the volume of the alkali cell. The magnetometer shown includes a baseplate of solid non-conducting, non-magnetic material such as glass, fused silica, crystalline material, fiberglass, polyimide, or plastic. A stacked structure of non-conductive, non-magnetic material such as glass, fused silica, crystalline material, fiberglass, polyimide, or plastic is mounted on and affixed to the baseplate.

The particular embodiment shown in FIG. 5 has been implemented with a minimum of conductive material. Some or all inputs to and/or outputs from the sensor can be carried by illumination signals on fiber optics. A distant electronic control system may thus be used to operate the sensor without bringing any currents into the immediate neighborhood of the sensor. Or a local set of electronics with a low magnetic signature may be used to control the device. Illumination signals may include illumination for the purpose of pumping the atomic vapor, probing the atomic vapor, heating the atomic vapor cell, and/or effecting modulation of optical properties of other illumination sources. In such a device, optical fibers transmit illumination signals from the sensor unit to the distant electronics/control unit. In any embodiment of a high-sensitivity magnetometer or other atomic sensor, it may be beneficial to address the system entirely by way of optics.

As explained above, one way of introducing heat into the system is by electrical resistive heating. A different method involves shining light onto an absorbent material, which then conducts the resulting heat to the vapor cell. Some examples of such optical heaters are shown schematically in FIGS. 6A-C. A system that includes an optical heater will typically include a dedicated heat illumination source.

Figure 6A:
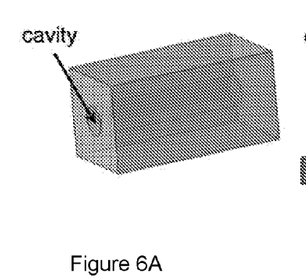
FIGS. 6A-C show three particular embodiments of an optical heater.
Figure 6B:
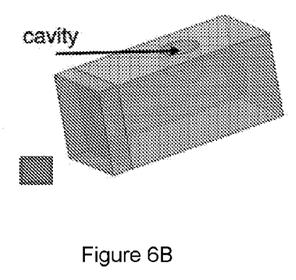
Figure 6C:
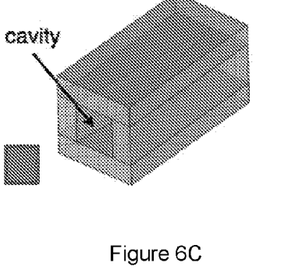

An optical heater for the cell may be entirely optical system with no electric currents, or partially optical. Systems with optical heaters can include an illumination source, such as a semiconductor laser, an LED, or a fiber optic carrying illumination from a distant source. In such embodiments, the illumination source may be directed into a cavity or onto a surface consisting of a material which strongly absorbs the illumination, or of a material which transmits the illumination, coated with a thin coating of a material which absorbs the illumination, or, in the case of a closed cavity, of a material which initially reflects the illumination. In this case, the illumination is blocked from exiting the cavity and the cavity heats up like a blackbody. The material of which the heater unit is made will have low electrical conductivity and be non-magnetic, but have a moderate to high thermal conductivity (greater than 0.1 W/m-K), and could be a polymer material such as polyimide, a thermally conductive ceramic such as aluminum nitride or boron nitride, a semiconductor material such as silicon, or a crystalline material such as diamond or sapphire. Shown in FIGS. 6A-C are examples of blocks of material which may be used to trap illumination and effect heating of an alkali cell. Illumination is to be directed into the cavity from an illumination source either directly or via an optical fiber or other optical elements. As shown in FIG. 6A, the cavity in the optical heater unit may be of a cylindrical shape such as is made by a drilled hole forming a blind bore. FIG. 6B shows an alternative in which a first blind bore is drilled and then capped, and a second perpendicular blind bore drilled to connect with the first. FIG. 6C shows a box shape made by an enclosure of flat-sided plates, the interior of which may be a triangular prism as shown, or another three dimensional shape.

If the heater is not optical, it may be an electrical resistive heater, including a resistive element through which current flows and generates excess heat. This may include flexible printed circuit board, consisting of etched copper traces on a substrate of non-conducting material which may be fiberglass, polyimide, ceramic or low-dielectric plastic with a protective layer of acrylic or teflon-based adhesive. All components of the heater should be able to withstand temperatures up to 200° C. The copper traces may be laid out in an even number of layers whereupon the majority of the trace in each layer is paired with an identical trace in a very close layer to minimize the externally generated magnetic field when the same current runs through both traces. The thickness and depth of the traces may be approximately equal, and the linear extent of each trace kept to a low value, for example less than 50 times the thickness/depth, in order to minimize the size of thermal eddy currents. These concepts regarding the circuit board design for the heaters are illustrated in FIGS. 3 and 4, both of which also apply to the design approach for some options for the baseplate circuit board and some options for the temperature sensor.

Alternatively, the heaters may consist of a substrate of a solid electrically insulating material such as ceramic or fiberglass, quartz, macor, alumina, aluminum nitride, boron nitride, polyimide, with a film or films of high-resistance paste such as platinum or graphite which may be screen printed, sprayed, painted or otherwise applied. The design of the film layout shall be to cancel externally generated field by printing multiple layers alternating between conductor and dielectric (insulating) layers of thin paste upon the thick substrate, and routing currents in opposing pairs on adjacent layers.

Regardless of type, the heater will typically be located in such proximity and thermal connection to the vapor cell (or other element to be heated) as to efficiently transmit heat to it. The cell and heater must be configured in such a way as to allow illumination to pass through at least one side of cell. Possibilities include a heater which obscures only some of the sides of the cell, or a heater that has a hole in the center to pass illumination, or a heater which itself transmits illumination.

All the various embodiments shown here include passive optical elements including but not limited to lenses, mirrors, diffraction gratings, waveplates, beamsplitters, optical filters, and polarizers. These may be used to set the characteristics of the illumination beams with regard to their spatial extent, spatial distribution, polarization characteristics, or wavelength. For example, a plano-convex lens may be used to collimate illumination emerging from an illumination source, then a linear polarizer may be used to select a single linear polarization state of that illumination, and a quarter wave plate may be used to convert the linearly polarized illumination to circularly polarized illumination which may be used to pump the alkali vapor.

All the various embodiments shown here include a detector in the optical path of a probe beam in the sensor. The detector may be located locally on the sensor or remotely wherein illumination may be coupled to the detector via an optical fiber. A detector may consist of a photodiode which converts the incident illumination to an electrical signal proportional to the amplitude of the incident illumination. The detector may further consist of a set of components which together form a polarimeter, separately detecting illumination of different polarization states. This may be achieved using a segmented photodiode in conjunction with either a pair of polarizers set at 90 degrees with respect to one another, or a mechanism to separate the polarization states of the illumination and cause them to illuminate different sections of the polarimeter or different optical fibers. This mechanism could be a crystal beam displacer made of a birefringent material such as YVO4 (Yttrium Ortho Vanadate).

Figure 7:
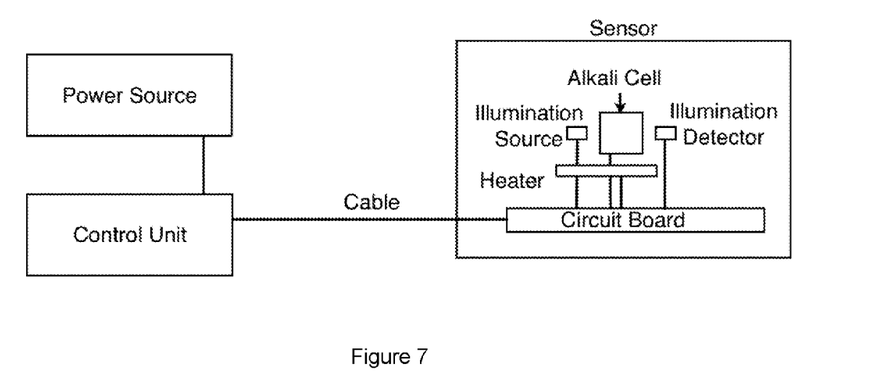
FIG. 7 shows schematically the relationship between a control system and a sensor assembly.

The sensors described herein will typically be operably connected to a control system. One possible relationship between the control system and the sensor assembly is illustrated in FIG. 7. The control system is largely physically separate from the sensor assembly, though some components described as parts of the control system may be located on the sensor assembly and vice versa. The control system can include a source of power, for example, an electrical outlet or a battery. The control system may employ a field-programmable gate array (FPGA) and/or a microprocessor. The control system may be capable of storing, retrieving and implementing a set of instructions which activate the sensor, and will collect and interpret data which may be used to determine the magnetic field in the region of the sensor, and/or the orientation of the sensor. Its components include control for the power of all illumination sources, and may include fine control of the wavelength of some of the illumination sources. The illumination sources may be able to operate in a continuous manner or may be caused to pulse on and off. The on and off pulsing may be synchronized to the Larmor precession of the alkali metal vapor atoms in the magnetic field which they experience. The control system can also include such components as are needed to interpret the illumination signal from the detector. These may include an amplifier, and an analog-to-digital converter. The control system can include a means for activating the heaters in the sensor, and can include a feedback system which locks the temperature of the cell, or an illumination source, based on a measurement of the temperature of the indicated component made using a temperature sensor. The control system may be capable of operating the sensor in the manner of a SERF vector magnetic field sensor, a Bell-Bloom scalar magnetic field sensor, or a gyroscope.

Figure 8:
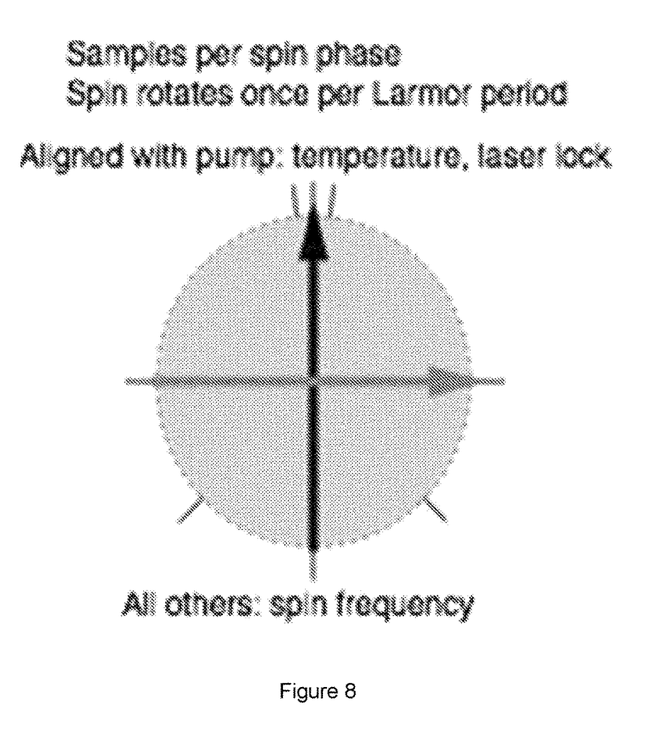
FIG. 8 illustrates a feature of a method of data sampling.

The modes of operation may be consistent with the SERF vector magnetic field sensor described in U.S. Pat. No. 7,038,450, or a Bell-Bloom scalar magnetic field sensor as described in U.S. Pat. No. 3,495,161, or a gyroscope. Analog-to-digital converters (ADC's) may be used to sample the various parameters measurable from the sensor, such as the signal level of the illumination detector. The ADC's sampling the signal from the illumination detector may optionally be configured to sample asynchronously in a manner that is optimized for determining the difference between the precession frequency and the pumping frequency—a signal that may be used to control the pumping and determine the magnetic field. The sampling may be done on FPGA-controlled clock which is phase and frequency locked to the atomic spins. The ADC may be operated to sample at different points in a given Larmor period and those different points give different information optimized to minimize interference from other sources of drift. The illumination source may be modulated at the Larmor frequency—when modulated on to the resonance, the absorption is higher, so measured transmission is lower. When sampling off the resonance, the spin orientation is evaluated, as shown in FIG. 8.

The magnetometer of FIG. 1 illustrates a concept beneficial for construction of such a device. One beneficial way of assembling micro parts like those in the sensors described above is by robotic vacuum grip. Such vacuum grip robotics are inefficient at flipping the parts around a horizontal axis. The magnetometer of FIG. 1 avoids the possibility of any such flipping by arranging all parts so that they have a flat, vacuum addressable surface facing upward, and arranging the parts so that their orientation in the sensor is the same as the orientation in which they typically emerge from fabrication. (As shown, the optical elements on either side of the vapor cell, actually present a sloped upward face, but could be designed with a horizontal upward face for this type of assembly.)

Figure 9:
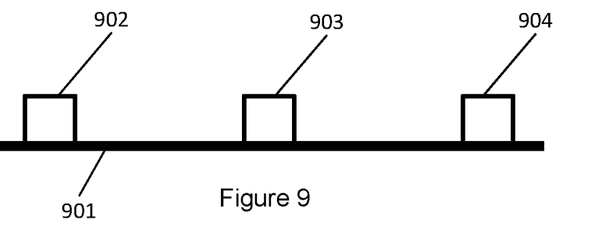
FIGS. 9-16 schematically show assemblies configured by bending a flexible substrate.
Figure 10:
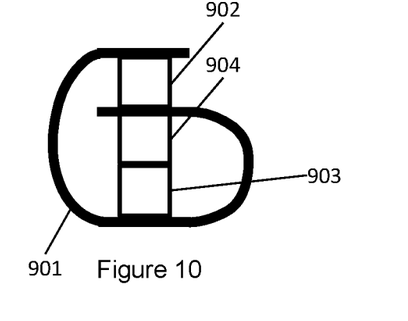
Figure 11:
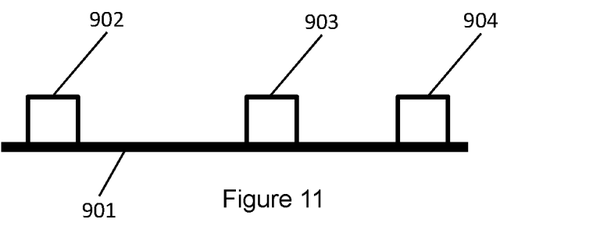
Figure 12:
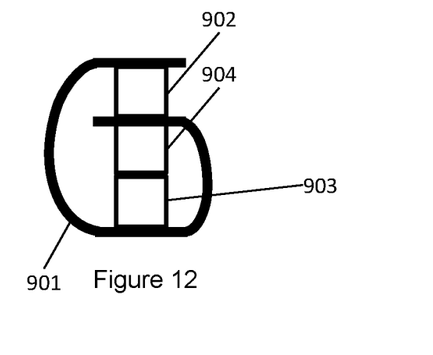
Figure 13:
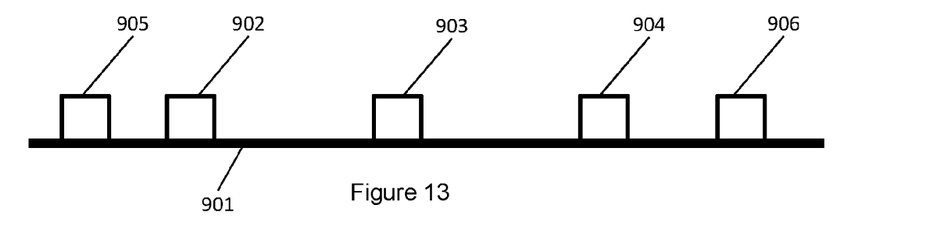
Figure 14:
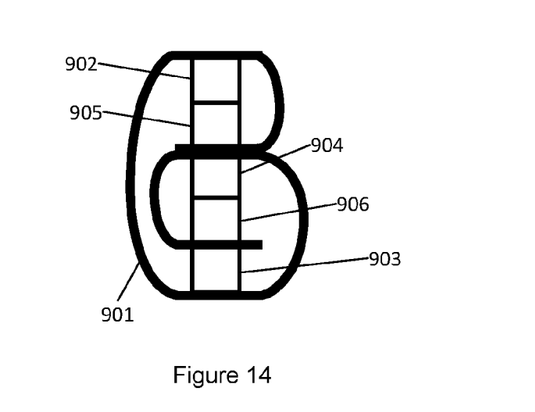

In another beneficial mode of construction, the various micro parts of a magnetometer or atomic sensor can be affixed to a flexible substrate 901 as shown in FIGS. 9-14. The parts can be, for example, a light source 902, a heater 903, and a vapor cell 904, stacked in the appropriate order by folding the substrate as shown in FIGS. 10 and 12. In order to achieve aligned stacking, the parts can either be spaced apart evenly on the substrate 901 as shown in FIG. 9, or spaced apart unevenly as shown in FIG. 11. Depending on the properties of the flexible substrate 901 it could be advantageous to have a heater 903 in direct contact with a vapor cell 904 with no intervening substrate. Alternatively, the positions of the micro parts could be rearranged so that different parts are in direct contact with one another. As shown in FIGS. 13 and 14, an arbitrary number of micro parts 902-906 could be attached to such a flexible substrate 901 and stacked in this way, given appropriate spacing of the parts along the substrate. Although an odd number of micro parts is shown in the figures, even numbers, indeed any number, of micro parts is equally achievable. Once the flexible substrate is folded so that the micro parts are appropriately stacked and secured, the flexible substrate could be left in place, or it could be trimmed away. The flexible substrate may be left in place if, for example, it include traces or other useful or necessary electronic components for controlling or otherwise interacting with any of the micro parts.

Figure 15:
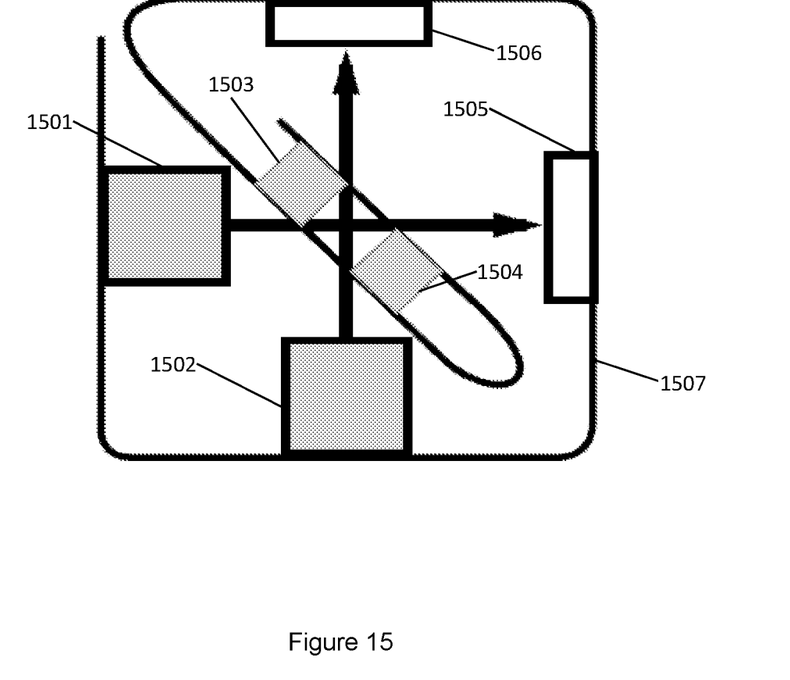

A flexible substrate could also be configured to carry micro parts in such a way that, when the flexible substrate is appropriately folded, the parts are not merely stacked, but achieve a more general advantageous arrangement of parts. FIG. 15 shows one such arrangement in which, when appropriately folded, light sources 1501, 1502, a vapor cell and heater, 1503, 1504, and detectors 1505, 1506 are arranged advantageously on a flexible substrate 1507 so that both vapor cell and heater are properly illuminated. The flexible substrate need not be configured to be folded all in a single plane, as shown in FIGS. 9-15. The substrate can be formed with various tabs and flaps, some of which are configured to be folded in one place while others are to be folded in another, possibly perpendicular, plane.

Figure 16:
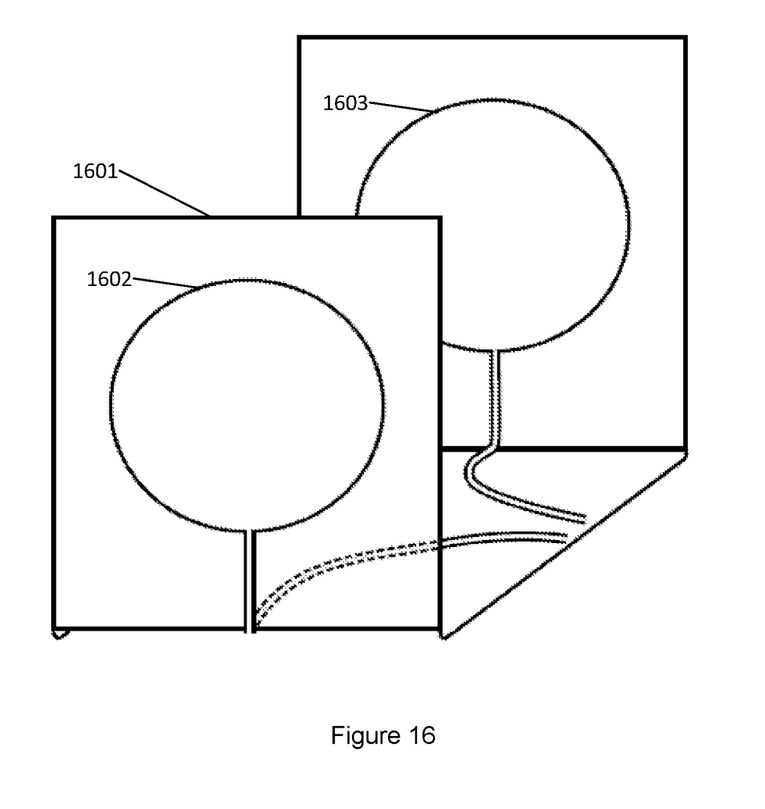

FIG. 16 shows how a flexible substrate 1601 in particular can be used to form a configuration of traces that create a predetermined magnetic field at a desired location. In this case, traces 1602, 1603 are configured roughly as Helmholtz coils to create a substantially uniform magnetic field over a central volume. This would be an advantageous arrangement for cancelling a predetermined background magnetic field, such as the earth's magnetic field.

SUMMARY OF CERTAIN EMBODIMENTS

An assembly for use in a high-sensitivity atomic sensor can include an alkali vapor cell, at least one illumination source configured to emit light when activated, the emitted light having a first predetermined range of wavelengths, a light collector capable of collecting light in the first predetermined range of wavelengths, and a plurality of optical elements arranged such that (a) light emitted from the at least one illumination source is directed to the alkali vapor cell, and (b) light emerging from the alkali vapor cell is directed to the light collector.

Such an assembly can also include a generally planar electrical insulator having a top and a bottom, the top and the bottom being opposed to one another, a top trace on the top of the insulator, a bottom trace on the bottom of the insulator, and a through trace, the insulator defining a via from the top to the bottom, the through trace contacting both the top trace and the bottom trace and passing through the via so that the top trace, bottom trace and through trace form a single electrically conductive element, wherein the top trace and the bottom trace are congruent so that a current along the single electrically conductive element tends to create a self-cancelling magnetic field.

Such an assembly can also include a generally planar electrical insulator having a top and a bottom, the top and the bottom being opposed to one another, a top trace on the top of the insulator, the top trace having a top trace height and a top trace width, and a bottom trace on the bottom of the insulator, the bottom trace having a bottom trace height and a bottom trace width, wherein the ratio of the top trace height to the top trace width and the ratio of the bottom trace height to the bottom trace width both being in the range of 0.5 to 2, and the top trace and the bottom trace are congruent so that when equal and oppositely directed currents exist simultaneously in the top trace and the bottom trace, the equal and oppositely directed currents tend to create cancelling magnetic fields.

In some such assemblies, the electrically conductive element is in thermal contact with the alkali vapor cell such that when current is passed through the electrically conductive element, thereby producing heat, the heat is transferred to the alkali vapor cell.

In some such assemblies, the electrically conductive element is in not substantially in thermal contact with the alkali vapor cell.

Such an assembly can include an optical heating element and a heat illumination source configured to emit light having a second predetermined range of wavelengths when activated, wherein the optical heating element is in thermal contact with the alkali vapor cell, the optical heating element includes a light-absorbing material that absorbs light in at least a portion of the second predetermined range of wavelengths, and the plurality of optical elements are arranged such that at least some light emitted from the heat illumination source is directed to the optical heating element.

In some such assemblies, the optical heating element defines an internal cavity, and substantially all of the at least some light emitted from the heat illumination source is directed to internal cavity.

In some such assemblies, the internal cavity is defined at least in part by an internal surface, the internal surface including at least a portion of the light-absorbing material.

In some such assemblies, substantially all surfaces defining the internal cavity are covered in the light-absorbing material such that substantially all of the light emitted from the heat illumination source and directed to the internal cavity is absorbed by the optical heating element.

In some such assemblies, light-absorbing material is disposed on a surface of the optical heating element that does not define any portion of the internal cavity.

In some such assemblies, the internal cavity is a blind bore.

In some such assemblies, the internal cavity is a polygonal prism.

In some such assemblies, the optical heating element includes on at least a portion of the interior surface a material that reflects light in at least a portion of the predetermined range of wavelengths.

In some such assemblies, a portion of the internal cavity is defined by a material that is (a) substantially transparent to light in at least a portion of the predetermined range of wavelengths and (b) substantially absorbent to light in a different wavelength range.

Such an assembly can include a temperature sensor configured to sense the temperature at a predetermined location on the assembly, and a controller that is, configured to receive from the temperature sensor signals indicative of the temperature at the predetermined location on the assembly, operably connected to the at least one heat illumination source, and configured to activate the at least one illumination source so as to illuminate the heating element. In some such assemblies, the temperature sensor includes substantially no electrical currents.

In some such assemblies, the first predetermined range of wavelengths and the second predetermined range of wavelengths are identical.

In some such assemblies, the first predetermined range of wavelengths and the second predetermined range of wavelengths have some wavelength in common but are not identical.

In some such assemblies, the first predetermined range of wavelengths and the second predetermined range of wavelengths have no wavelength in common.

Such assemblies can include an electrical insulator having a surface, and a trace disposed on the surface of the insulator, wherein the trace is configured so that, when a predetermined current is passed through the trace, a magnetic field having a desired predetermined geometry and magnitude is created.

In some such assemblies, the desired predetermined geometry and magnitude substantially cancels a background magnetic field in a predetermined volume that includes at least a portion of the assembly. The background magnetic field can be manmade, or can be, for example, the earth's magnetic field.

Such assemblies can include an electrical insulator having a surface, and a trace on the surface of the insulator, wherein the trace has a filamentary structure comprising a plurality of electrically insulated sub-traces. In some such assemblies, the filamentary structure is configured to minimize magnetic field fluctuation in a predetermined volume that includes at least a portion of the assembly.

A method of assembling a high-sensitivity atomic sensor can include providing a substantially planar horizontal substrate, vertically depositing above the provided substrate the at least one illumination source, vertically depositing above the provided substrate the light collector, vertically depositing above the provided substrate the alkali vapor cell, and vertically depositing above the provided substrate the plurality of optical elements, wherein after being vertically deposited above the provided substrate, none of the at least one illumination source, the light collector, the alkali vapor cell, and the plurality of optical elements is (a) reshaped, or (b) rotated about a horizontal axis.

A method of assembling a high-sensitivity atomic sensor can include providing a flexible, substantially planar substrate, affixing to the substrate an alkali vapor cell and at least one other component of the atomic sensor, and bending the flexible substrate so that the alkali vapor cell and the at least one other component of the atomic sensor are substantially mutually disposed in a predetermined relative position.

We claim:

1. A magnetometer comprising:
   an alkali vapor cell;
   at least one illumination source configured to emit light when activated, the emitted light having a first range of wavelengths;
   at least one light detector, the light detector capable of receiving light in the first range of wavelengths;
   a heating element;
   a baseplate having a top surface and a bottom surface, the top and the bottom surfaces being opposed to one another, the baseplate folded such that a first portion of the top surface is oriented at an angle with respect to a second portion of the top surface;
   wherein light emitted from the at least one illumination source is directed to the alkali vapor cell, and light emerging from the alkali vapor cell is directed to the light detector; and
   wherein a first illumination source is disposed on the first portion of the baseplate top surface, and a second illumination source is disposed on the second portion of the baseplate top surface.

2. The magnetometer of claim 1, wherein the first portion of the top surface is oriented at an angle of approximately 45 degrees with respect to a second portion of the top surface.

3. The magnetometer of claim 1, wherein the first portion of the top surface is oriented at an angle of approximately 90 degrees with respect to a second portion of the top surface.

4. The magnetometer of claim 1, wherein the first portion of the top surface is oriented at an angle greater than 90 degrees with respect to a second portion of the top surface.

5. The magnetometer of claim 1, wherein the alkali vapor cell, illumination source, light detector and heating element are disposed on the top surface of the baseplate.

6. The magnetometer of claim 5, wherein each of the alkali vapor cell, illumination source, light detector and heating element are evenly spaced apart.

7. The magnetometer of claim 1, wherein the alkali vapor cell and heating element are in direct contact.

8. The magnetometer of claim 1, wherein the baseplate is folded such that the alkali vapor cell and heating element are in contact with the top surface and bottom surface of the baseplate.

9. A magnetometer comprising:
   an alkali vapor cell;
   a first illumination source configured to emit light when activated, the emitted light having a first range of wavelengths;
   a second illumination source configured to emit light when activated, the emitted light having a second range of wavelengths;
   a first light detector, the first light detector capable of receiving light in the first range of wavelengths;
   a second light detector, the second light detector capable of receiving light in the second range of wavelengths;
   a heating element;
   a baseplate having a top surface and a bottom surface, the top and the bottom surfaces being opposed to one another, the baseplate folded about a vertical axis such that a first portion of the top surface is oriented at an angle with respect to a second portion of the top surface;

wherein light emitted from the first illumination source is directed through the alkali vapor cell and received by the first light detector, and light emitted from the second illumination source is directed through the alkali vapor cell and received by the second light detector; and a conductive top trace on the top of the baseplate and a conductive bottom trace on the bottom of the baseplate, wherein the top trace and the bottom trace are congruent so that a current along the single electrically conductive element tends to create a self-cancelling magnetic field.

10. The magnetometer of claim 9, wherein at least one of the conductive top or bottom traces are in thermal contact with the alkali vapor cell such that when current is passed through the trace heat is transferred to the alkali vapor cell.

11. The magnetometer of claim 9, wherein the top trace, or the bottom trace, or both are not substantially in thermal contact with the alkali vapor cell.

12. The magnetometer of claim 9, wherein the heating element is an optical heating element with an internal cavity, with substantially all of the light emitted from at least one of the illumination sources directed to the internal cavity.

13. The magnetometer of claim 9, further comprising:
a temperature sensor configured to sense the temperature at a predetermined location; and
a controller that is:
configured to receive from the temperature sensor signals indicative of the temperature at the sensor location;
operably connected to the at least one illumination source; and
configured to activate the at least one illumination source so as to illuminate the heating element.

14. The magnetometer of claim 13, wherein the temperature sensor includes substantially no electrical currents.

15. The magnetometer of claim 9, wherein the first range of wavelengths and the second range of wavelengths are identical.

16. The magnetometer of claim 9, wherein the first range of wavelengths and the second range of wavelengths have some wavelength in common.

17. The magnetometer of claim 9, wherein the first range of wavelengths and the second range of wavelengths have no wavelength in common.

18. A method of assembling a magnetometer comprising:
providing a baseplate;
depositing an alkali vapor cell on a first surface of the baseplate;
depositing at least one illumination source on the first surface of the baseplate, the at least one illumination source configured to emit light when activated, the emitted light in a first range of wavelengths;
depositing at least one light detector on the first surface of the baseplate, the light detector capable of receiving light in the first range of wavelengths;
depositing a heating element on the first surface of the baseplate;
folding the baseplate such that a first portion of the first surface is oriented at an angle with respect to a second portion of the first surface;
wherein light emitted from the at least one illumination source is directed to the alkali vapor cell, and light emerging from the alkali vapor cell is directed to the light detector; and
wherein a first illumination source is disposed on the first portion of the baseplate top surface, and a second illumination source is disposed on the second portion of the baseplate top surface.

* * * * *